United States Patent [19]

Heard et al.

[11] Patent Number: 5,428,861
[45] Date of Patent: Jul. 4, 1995

[54] METHOD AND APPARATUS FOR CLEANING A PROCESSING TUBE

[75] Inventors: Kim A. Heard, Tempe; Anatoly Leef, Phoenix; Eldean N. Dyslin, Mesa; James E. Skinner, Tempe, all of Ariz.

[73] Assignee: Motorola, Schaumburg, Ill.

[21] Appl. No.: 100,398

[22] Filed: Aug. 2, 1993

[51] Int. Cl.⁶ .............................................. A47L 5/14
[52] U.S. Cl. ............................... 15/304; 15/345; 15/354
[58] Field of Search ............. 15/304, 345, 346, 354, 15/362, 395; 432/11

[56] References Cited

U.S. PATENT DOCUMENTS

| | | | |
|---|---|---|---|
| 1,854,471 | 4/1932 | Hofman | 15/304 |
| 2,302,078 | 11/1942 | Wadman | 15/304 |
| 2,309,290 | 1/1943 | Aksomitas | 15/304 |
| 4,243,378 | 1/1981 | Chronberg | 432/11 |
| 4,341,568 | 7/1982 | Christensen | 15/304 |
| 4,671,708 | 6/1987 | Hurd | 15/345 |
| 4,733,428 | 3/1988 | Malinge | 15/304 |
| 4,976,002 | 12/1990 | Leonov | 15/304 |
| 5,109,567 | 5/1992 | Harrison | 15/345 |

*Primary Examiner*—David A. Scherbel
*Assistant Examiner*—Terrence R. Till
*Attorney, Agent, or Firm*—Miriam Jackson

[57] ABSTRACT

A method for cleaning a processing tube is performed by an apparatus providing a vacuum and a flow of an inert gas. The flow of the inert gas dislodges particles from the tube surface and assists in carrying the particles to the vacuum. The vacuum is centered in the tube, thus preventing the sides of the tube from being scraped. Wheels are attached to the vacuum means to facilitate cleaning of the tube.

8 Claims, 2 Drawing Sheets

METHOD AND APPARATUS FOR CLEANING A PROCESSING TUBE

BACKGROUND OF THE INVENTION

This invention relates to, in general, the cleaning of processing tubes, and more particularly, but not limited to, the removal of particles from a processing tube used for semiconductor processing.

In semiconductor wafer processing, the wafers are processed in a furnace which is in the shape of a cylindrical tube made of quartz. It is important that these be substantially free of any particles which can be deposited on semiconductor wafers which are processed therein. Particles deposited on the wafers can result in defects formed in the semiconductor device.

Therefore, in situ cleaning is performed periodically on the tube to try to remove loose particles present in the tube. After in situ cleaning, tests must then be performed on the tube to ensure that the number of particles present in the tube are below a minimum level. This test entails inserting dummy wafers which have a known quantity of particles thereon, running a temperature cycle, and then remeasuring the amount of particles on the wafer. If the particle count has gone up by a certain amount, the tube must then be cleaned, in situ, before a production run may start.

In the past, in situ cleaning involved using a vacuum wand having a triangular shaped head on one end (similar to a standard attachment for a vacuum cleaner used in the home). The vacuum pull was from the bottom of the head. The vacuum wand was inserted into the tube to vacuum any loose particles which had fallen to the bottom portion of the tube.

One of the problems with this method was that the vacuum head often scraped the sides of the tube which created more particles to be removed. These additional particles were created by scratching of the tube itself or by scraping of a film deposited on the tube. The scraping of the film caused the film to flake and create more particles.

In addition, the vacuum head focused the vacuum only in a lower quadrant of the tube, therefore, only loose particles which fell to the bottom or which could be dislodged by the vacuum were removed. Particles which were lodged in other quadrants of the tube were not removed by the vacuum. However, these particles could be dislodged during the processing of semiconductor wafers, resulting in defects formed on the semiconductor devices formed on the wafers. Basically, this crude method of removing particles was ineffective and needed much improvement.

If in situ cleaning fails to provide a certain level of cleanliness in the tube, it must be removed from a furnace bank and chemically cleaned. The process of removing the tube from the furnace bank is cumbersome and time consuming. The tube must first be cooled down from an operating temperature of approximately 400° C. before removal. A new tube must be inserted and brought up to operating temperature. It would be desirable to have a more effective in situ clean in order to reduce the amount of times the tubes must be changed.

SUMMARY OF THE INVENTION

An apparatus and method for cleaning a tube is accomplished by a vacuum means coupled to a flow of a gas. The vacuum means is coupled to a means for supporting the vacuum means against a surface.

DETAILED DESCRIPTION OF THE DRAWINGS

Figure 1:
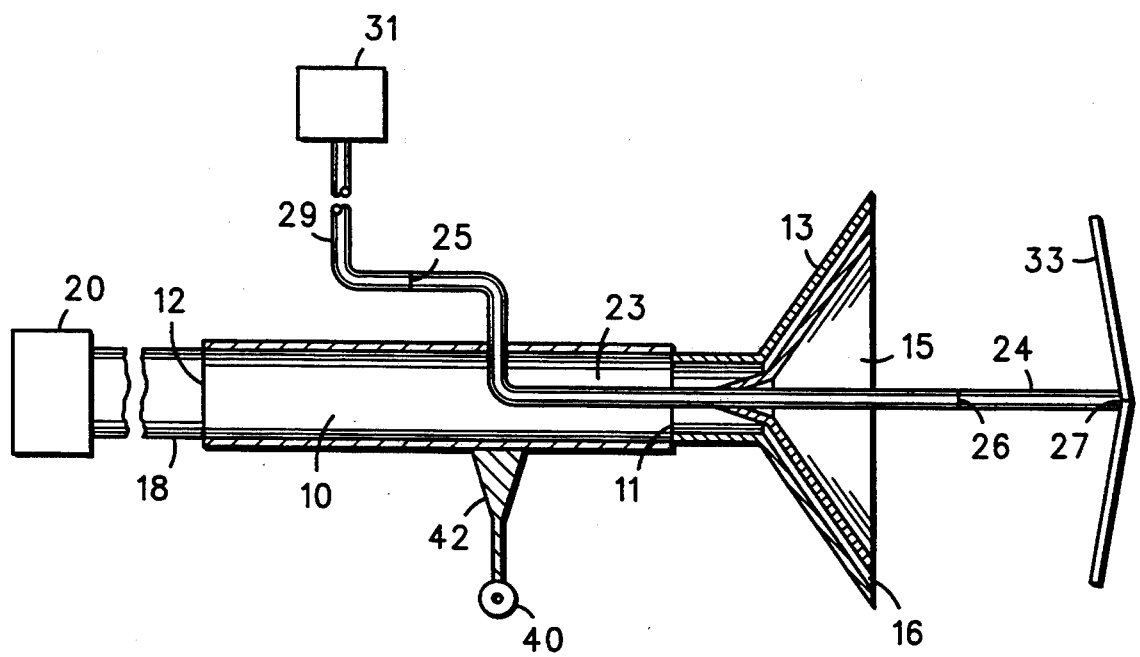
FIG. 1 illustrates a partial cross sectional view and a partial side view of an embodiment of an apparatus of the present invention.

FIG. 1 illustrates an embodiment of the present invention. What is shown is an apparatus comprised of a means for distributing a vacuum or conduit 10 having a first end 11 and a second end 12. First end 11 is adapted to receive a vacuum head 13 having a substantially circular face 15 and at least one vacuum channel 16 formed preferably at the perimeter of face 15. By forming vacuum channel 16 at the perimeter, the vacuum can be focused substantially at the perimeter of a tube, at walls 38 of a processing tube 37 (shown in FIG. 2), to provide for more efficient removal of the particles which will be dislodged from walls 38. The amount of vacuum necessary should be enough to effectively remove particles present in the tube. It was found that 20–30 inches of mercury was adequate to remove particles found in semiconductor processing. Vacuum channel 16 communicates with conduit 10. Vacuum head 13 is preferably removably coupled to conduit 10 at first end 11.

It is desirable that vacuum head 13 have a diameter which closely fits the diameter of diffusion tube 37 to be cleaned, to more efficiently remove particles from tube 37. Therefore, in a preferred embodiment, face 15 of vacuum head 13 has a diameter which closely fits the diameter of the tube to be cleaned. It was found that a diameter one-half inch less than the diameter of tube 37 was adequate for particle removal and prevention of scraping the sides of tube 37. Scraping the sides of the tube can cause scratching of the tube which creates more unnecessary particles or scratching of the film deposited on the diffusion tube which causes flaking and the creation of more particles.

At second end 12, vacuum connection or hose 18 is preferably removably coupled to conduit 10. A vacuum means 20 is coupled to vacuum hose 18. Vacuum means 20 can be provided by, for example, a pump which provides a pressure differential to cause a vacuum from vacuum head 13 to vacuum means 20. Conduit 10 and vacuum head 13 are shown in cross section, while the remainder of the apparatus in shown in side view to better illustrate the apparatus.

The apparatus is also comprised of a means for providing an inert gas flow adjacent vacuum head 13. An inert gas supply means 31 is coupled to a hose 29 which is coupled to a first end 25 of a conduit 24. Inert gas supply means 31 can be provided, for example, by a pump providing a pressure differential to cause flow of the inert gas out of pipes 33. In a preferred embodiment, conduit 24 is coupled to conduit 10 through an inlet hole 23 formed in conduit 10 and runs inside a portion of conduit 10 and vacuum head 13.

Figure 2:
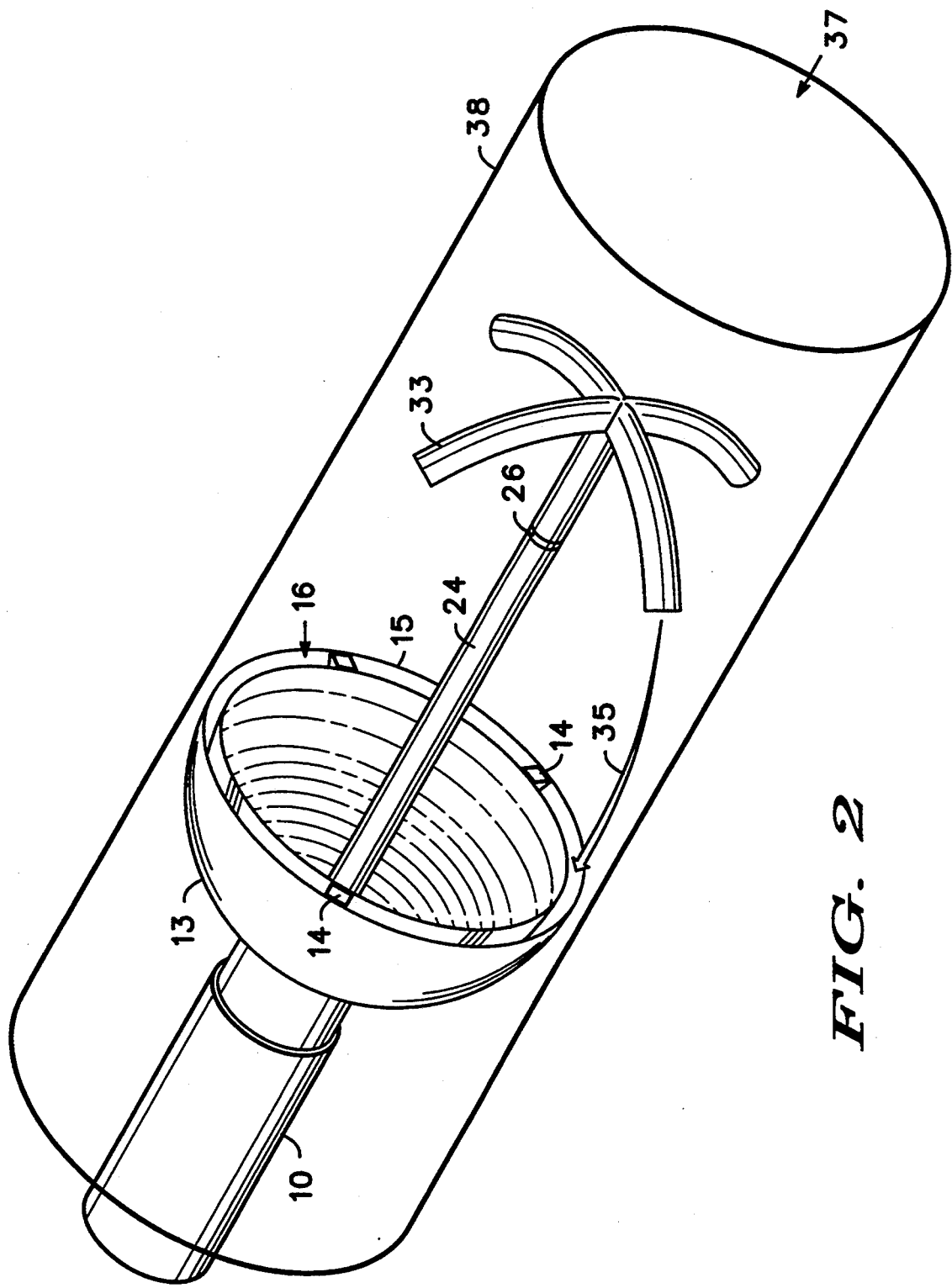
FIG. 2 illustrates a perspective view of a portion of an embodiment of an apparatus of the present invention.

At a second end 27 of conduit 24, a plurality of pipes 33 extend outwardly from conduit 24. Pipes 33 are configured to provide a flow of an inert gas 35, as shown in FIG. 2, so that the flow of inert gas 35 is directed against walls 38 of processing tube 37. Preferably, pipes 33 are configured to direct inert gas 35 toward vacuum channel 16 to facilitate the removal of particles from tube 37. Note that in this embodiment shown in FIG. 2, pipes 33 are straight, but directed at an angle toward vacuum head 13. FIG. 2 illustrates another configuration of pipes 33, which are shown to be curved toward vacuum head 13. Other configurations are possible, as long as inert gas flow 35 is directed toward walls 38 and vacuum head 13, in the preferred embodiment. In a preferred embodiment, four pipes 33 are used in order to provide inert gas flow 35 in each quadrant of tube 37. Obviously, more pipes 33 would provide for more efficient removal of particles. Further, in a preferred embodiment, pipes 33 should extend radially toward walls 38 of tube 37 as far as vacuum head 13.

The pressure of the flow of inert gas 35 should be enough to effectively dislodge particles present in the tube. It was found that 30-50 pounds per square inch was adequate to dislodge particles found in semiconductor processing tubes.

A first embodiment of a means for supporting conduit 10 is provided by support members 42 coupled to conduit 10. Rolling means or wheels 40 are coupled to support members 42. The purpose of support members 42 and wheels 40 will be discussed with reference to FIG. 3 below.

FIG. 2 illustrates that vacuum head 13 may also be configured in a substantially spherical configuration rather than a conical configuration as shown in FIG. 1. Any configuration is possible. Vacuum channel 16 is preferably sealed against conduit 24 (one embodiment shown in FIG. 1) in order to focus the vacuum at the perimeter of face 15 of vacuum head 13. In this manner, particles which are dislodged from walls 38 of a processing tube 37 are assisted into vacuum channel 16 by the flow of vacuum and inert gas flow 35. FIG. 1 illustrates only one way in which vacuum channel 16 may be sealed against conduit 24. It is also possible to provide a stopper or O-ring around conduit 24 abutting the walls of conduit 24 and the walls of vacuum channel 16 to seal off the remainder of vacuum head 13 and conduit 10. Spacers 14 are used to facilitate forming channel 16 if vacuum head 13 is formed as a cone within a cone configuration.

It is preferable that pipes 33 can be removed from conduit 24 in order to facilitate the changing of vacuum head 13. In one embodiment, pipes 33 may be removed by removing a portion of conduit 24 along with conduits 23 at a coupling 26 provided in conduit 24.

Figure 3:
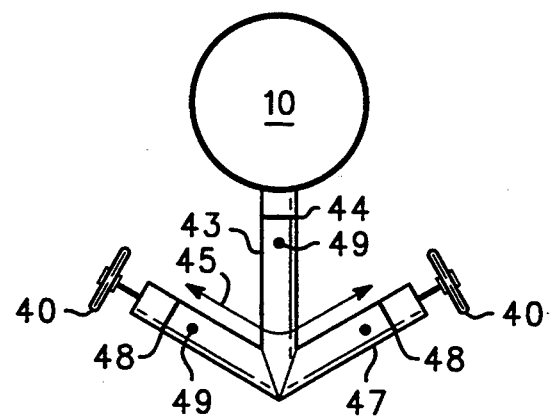
FIG. 3 illustrates a frontal view of a portion of an embodiment of an apparatus of the present invention.

FIG. 3 illustrates a frontal view of a portion of an embodiment of the present invention. A second embodiment of a means for supporting conduit 10 is provided by a support member having a substantially vertical portion 43 coupled to conduit 10. Two outwardly extending portions 47 of the support member outwardly extend away from vertical portion 43. A pair of rolling means or wheels 40 are coupled to each portion 47 of the support member. Wheels 40 and the support member preferably also provide for a means for centering the apparatus within processing tube 37. Wheels 40 are preferably at an angle of approximately 120°, measured from the center of conduit 10 and illustrated by line 45, in order to facilitate centering vacuum head 13 within tube 37. The centering of vacuum head 13 within processing tube 37 is important so that vacuum head 13 does not scrape walls 38 of processing tube 37.

Wheels 40 are preferably comprised of ceramic or other inert materials which do not leave contamination on tube walls 38. The remainder of the apparatus of the present invention may be fabricated of any material which can withstand temperatures of at least 400° C., such as, for example stainless steel, ceramic, or quartz, to name a few. The apparatus preferably should be able to withstand such temperatures so that the tube may be cleaned in situ, while it is at idle temperature. Wheels 40 facilitate the insertion and removal of the apparatus within a tube 37 and prevent scratching of tube walls.

To increase the usability of the cleaning apparatus of the present invention, the support member and wheels 40 should be able to retract or extend toward or away from conduit 10 in order to use and center the apparatus within tubes of a different size. This is accomplished by having vertical portion 43 of the support member retractable at a location 44 and outwardly extending portions 47 retractable at locations 48. A position may be held in place by a set screw 44 on the vertical portion 43 and set screws 48 on the outwardly extending portions 47, for example. In addition, if the apparatus of the present invention is utilized in a vertical tube, rather than a horizontal tube, the means for centering the apparatus would preferably need to be comprised of a third wheel 40 (not shown) supported by another support member having a portion similar to vertical portion 43 in order to center the apparatus within a vertical tube. As stated above, vacuum head 13 is also preferably removably coupled to conduit 10. Thus, the apparatus of the present invention can be used and optimized for cleaning of various tube sizes.

Note that only two ways of supporting and/or centering the apparatus of the present invention in a tube has been shown. These are only two ways in which this may be done, many other ways are possible.

With reference to all of the FIGS. of the present invention, processing tube 37 is cleaned by inserting the apparatus of the present invention into the opening of processing tube 37. Vacuum means 20 and the flow of inert gas 35 are turned on while the apparatus is inserted into processing tube 37 and removed from processing tube 37. The flow of inert gas 35 will dislodge any particles which are stuck to the sides of the processing tube 38 and assist in directing those and other loose particles into vacuum head 13. The flow of inert gas 35 is important to facilitate the removal of particles which are lodged into walls 38 and cannot be removed simply by vacuum means 20 alone.

It is important to note that the apparatus of the present invention does not remove the film which is commonly deposited on the sides of tube 37 during some of the processing of semiconductor wafers. It is only desirable to remove particles and dust which are loose enough to be deposited on semiconductor wafers during processing. It was found that an insertion and removal rate of the apparatus of the present invention of approximately two inches per second was adequate to remove these particles from processing tube 37.

As can be seen, an apparatus and method for cleaning processing tubes, in situ, has been provided. The apparatus of the present invention allows for the dislodging of particles from the walls of a diffusion tube and subsequent removal thereof. In addition, the apparatus of the present invention minimizes the amount of scraping of the sides of a diffusion tube which creates more particles that must be removed. The apparatus of the present invention is easy to use and the method of using it is not time consuming. Therefore, the removal and replacement of processing tubes for a chemical clean can be extended or minimized by using the apparatus of the present invention.

We claim:

1. A cleaning apparatus, comprising:

a conduit having a first end and a second end;

means for providing a vacuum coupled to the first end of the conduit;

a head having a face coupled to the second end of the conduit, wherein the face has at least one channel formed therein wherein the at least one channel is coupled to the vacuum means;

means for providing a flow of a gas coupled to the head wherein the gas is directed at an angle toward the head; and means for supporting the conduit against a surface coupled to the conduit, the supporting means including a means for rolling comprised of ceramic.

2. The apparatus of claim 1 wherein the head has a substantially circular face.

3. The apparatus of claim 2 wherein the head has a diameter which closely fits a diameter of a tube in which the apparatus is inserted.

4. The apparatus of claim 2 wherein the head has a diameter of approximately one-half inch less than a diameter of a tube in which the apparatus is inserted.

5. The apparatus of claim 4 wherein the rolling means are comprised of two wheels.

6. The apparatus of claim 1 wherein the head is removably coupled to the conduit.

7. The apparatus of claim 1 wherein the supporting means is adjustable for appropriate positioning within the tube.

8. The apparatus of claim 1 wherein the gas means is provided by a conduit positioned inside the head.

* * * * *